United States Patent
Nomura

[11] Patent Number: 5,978,395
[45] Date of Patent: Nov. 2, 1999

[54] LIGHT TRANSMITTING APPARATUS

[75] Inventor: Kenichi Nomura, Tokyo, Japan

[73] Assignee: NEC Corporation, Tokyo, Japan

[21] Appl. No.: 08/778,137

[22] Filed: Jan. 2, 1997

[30] Foreign Application Priority Data

Jan. 10, 1996 [JP] Japan ..................................... 8-001855

[51] Int. Cl.$^6$ ...................................................... H01S 3/04
[52] U.S. Cl. .................................. 372/34; 372/29; 372/38
[58] Field of Search .................................. 372/34, 29, 38

[56] References Cited

FOREIGN PATENT DOCUMENTS 61-163737  7/1986  Japan .
4-196377   7/1992  Japan .
5-292030  11/1993  Japan .

OTHER PUBLICATIONS

Wittke et al; "Stabilization of CW Injection Lasers";Technical Notes 1005,sheets 1–3;Apr. 1975.

*Primary Examiner*—Leon Scott, Jr.
*Attorney, Agent, or Firm*—Young & Thompson

[57] ABSTRACT

A light transmitting circuit of a light wave length multiplexing apparatus comprises a LD module 2 including a semiconductor laser device, a temperature control circuit 3 and a driving current generating circuit for providing the semiconductor laser device with a driving current. A temperature control circuit 3 generates a temperature error signal, when the difference between a temperature monitor signal and a temperature set signal is too great, that is, while the wave length is not normal. The temperature error signal is input to a LD driver 1, a bias circuit 4 or a light amplifier 6, and the light output signal stops. The light transmitting circuit has no influence on the output signal of the light transmitting circuit of a remaining wavelength for the light wave length multiplexing operation, when the temperature of the semiconductor laser device differs significantly the temperature set value because of the set-up process or a failure.

17 Claims, 4 Drawing Sheets

LIGHT TRANSMITTING APPARATUS

BACKGROUND OF INVENTION

The present invention relates to a light transmitting apparatus. More particularly, the present invention relates to a light transmitting circuit in a wavelength multiplexing communication system.

A light wavelength multiplexing transmitting system was recently developed, and research to put the system to practical use is progressing. This system uses a light wavelength multiplexer to multiplex and transmit more than two light signals.

In the light wavelength multiplexing transmission system, it is necessary that two adjacent wavelengths $\lambda1$ and $\lambda2$ in more than two light signals are separated from each other. If the two adjacent wavelengths $\lambda1$ and $\lambda2$ coincide with each other or are extremely close to each other, it is not possible to separate the two signals, and this situation affects the signal transmitting and receiving operation.

It is necessary to control each transmission wavelength to a set value. The oscillation wavelength of a semi-conductor laser device varies on the basis of the temperature of the device, which is approximately the same as ambient temperature. Therefore, the conventional light transmitting circuit is provided with a LD (laser diode) driver for receiving a data signal to be transmitted and outputting a driving current to drive a semi-conductor laser device, a LD module for (a) outputting a light signal based on the driving current input from this LD driver and also (b) receiving an input of a temperature control signal to thereby change a temperature and (c) outputting the temperature as a temperature monitor signal; and a temperature control circuit for comparing a temperature set signal input from an external portion with the temperature monitor signal input from the LD module thereby to output the temperature control signal.

A light transmitting circuit which has different oscillation wavelengths is obtained by setting the temperature set signal in the temperature control circuit such that the oscillation wavelength is different for each light transmitting circuit.

This conventional light transmitting circuit usually sends out a light signal having a wavelength based on the temperature set signal. However, the temperature within the LD module is typically different from the set temperature right after a set-up operation such as turning on a power supply. This causes a problem in that a wavelength different from the wave length based on the temperature set signal is sent out. For example, when a light transmitting circuit A was already set up, if another light transmitting circuit B is set up later, there is a possibility that the other transmitting apparatus B may temporarily send out the signal having the wavelength of the light transmitting circuit A, until the wavelength of the light transmitting circuit B becomes stable.

SUMMARY OF THE INVENTION

It is, therefore, an object of the present invention to provide a light transmitting circuit, which stops the light output signal when a temperature of a semi-conductor laser device differs from a set value, that is, a wavelength is not normal.

A light transmitting apparatus of present invention comprises a LD module including a semi-conductor laser device, a temperature control circuit and a driving current generating means for providing the semi-conductor laser device with a driving current. The temperature control circuit sets a temperature of the semi-conductor laser device to a set value and outputs a temperature error signal which stops an output light signal when the temperature of the semi-conductor laser device differs from the set value by a predetermined value.

A light transmitting method according to the invention comprises the following steps: first, the temperature of a semi-conductor laser device is monitored, whereupon a set temperature of the semi-conductor laser device is compared with the monitored temperature, and an output light signal is stopped when said monitored temperature of said semi-conductor laser device differs from said set temperature by a predetermined value.

In this apparatus and method, the output light signal is stopped while the monitored temperature of the semi-conductor laser device is out of said set temperature by a predetermined value. Therefore, there is no influence on the output signal of the light transmitting circuit of a remaining wavelength for the light wavelength multiplexing operation.

BRIEF DESCRIPTION OF THE DRAWINGS

The above and other object, feature and advantages of the present invention will become apparent from the following detailed description when taken with the accompanying drawings in which.

DESCRIPTION OF THE PREFERRED EMBODIMENTS

To better understand the present invention, a brief reference will be made to a block diagram of a light wave multiplexing circuit shown in FIG. 1, light spectrum views shown in FIGS. 2A–2C and a block diagram of a conventional light transmitting circuit shown in FIG. 3.

Figure 1:
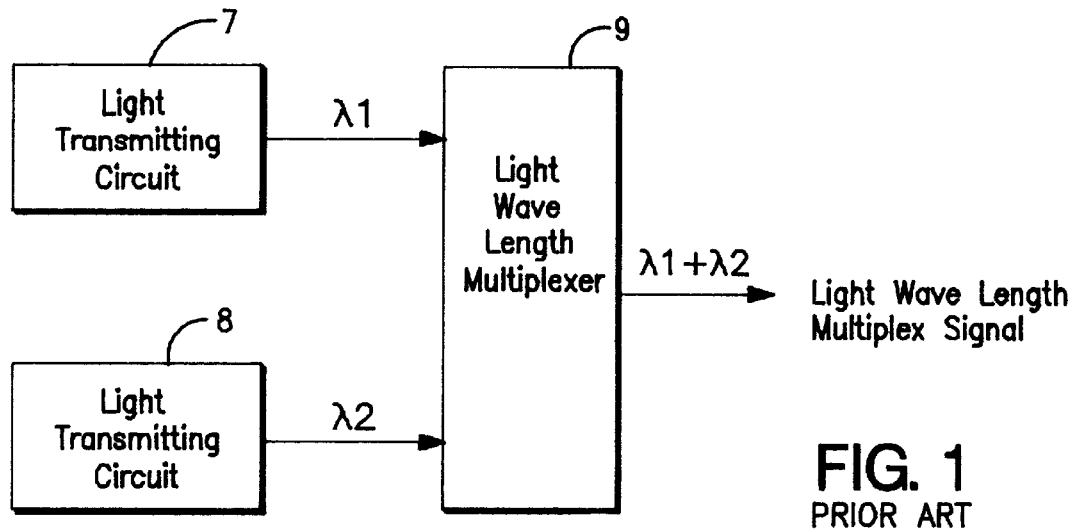
FIG. 1 is a block diagram of a conventional light wave length multiplexing circuit.

FIG. 1 shows an example of a light wavelength multiplexing circuit used in the light wavelength multiplexing system. An output signal from a light transmitting circuit 7 of a wave length $\lambda1$ and an output signal from a light transmitting circuit 8 of a wavelength $\lambda2$ are inputted to a light wavelength multiplexer 9, to produce a light wavelength multiplexing signal.

Figure 2A:
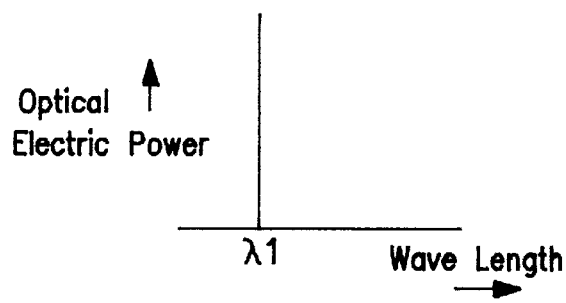
FIGS. 2A and 2B are light spectrum views of light transmitting circuit 7, 8 in FIG. 1 respectively.
Figure 2B:
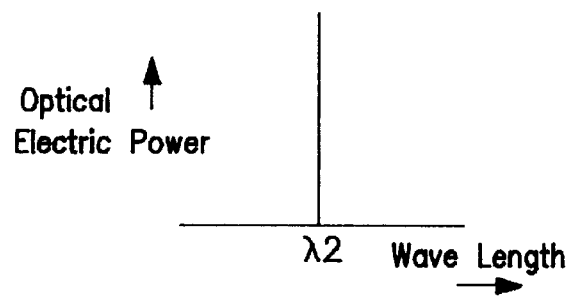
Figure 2C:
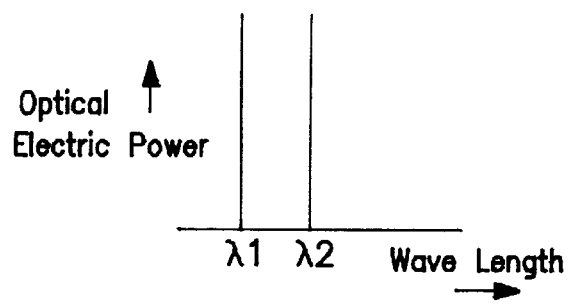
FIG. 2C is a light spectrum view of a light wave length multiplexing circuit 9 in FIG. 1.

FIG. 2A shows a spectrum in the output signal from the light transmitting circuit 7 of the wavelength $\lambda1$. FIG. 2B shows a spectrum in the output signal from the light transmitting circuit 8 of the wavelength $\lambda2$. FIG. 2C shows a spectrum in the light wavelength multiplexing signal. As discussed above, it is necessary to control the wave lengths $\lambda1$ and $\lambda2$ to a specified value.

Figure 3:
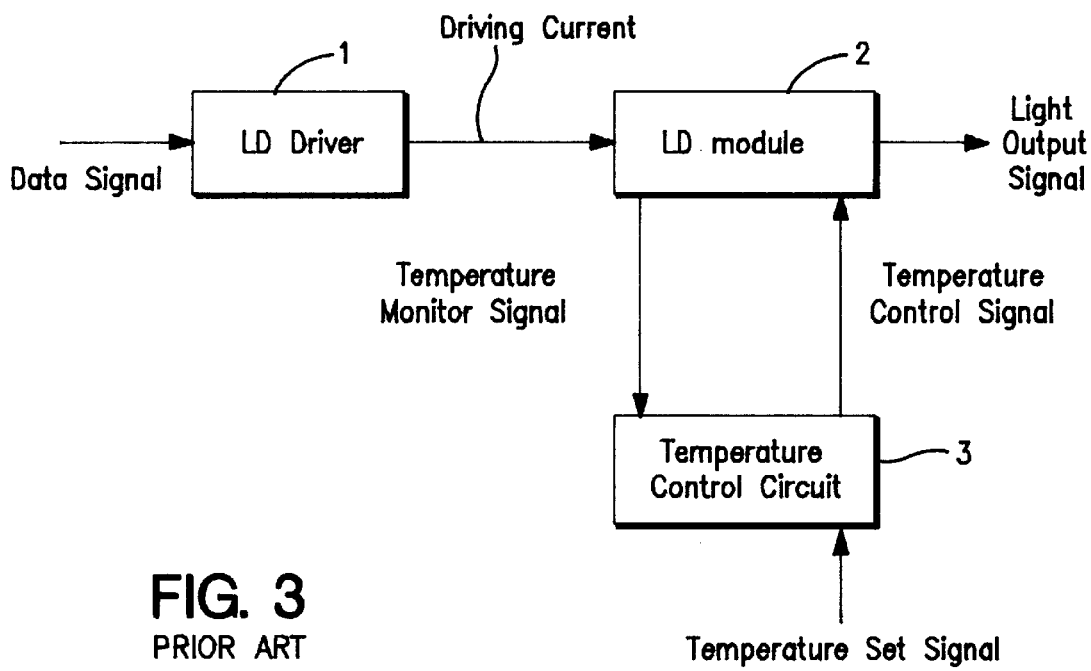
FIG. 3 is a block diagram of a conventional light transmitting circuit.

FIG. 3 shows an example of a conventional light transmitting circuit. The conventional light transmitting circuit is provided with: a LD (laser diode) driver 1 for receiving a data signal to be transmitted and outputting a driving current including a pulse current to drive a semi-conductor laser device and a bias current; a LD module 2 for outputting a light signal based on the driving current input from this LD driver 1 and also receiving an input of a temperature control signal to change a temperature, and outputting the temperature as a temperature monitor signal; and a temperature control circuit 3 for comparing a temperature set signal input from an external portion with the temperature monitor signal input from the LD module 2 to thereby generate the temperature control signal.

However, the conventional light transmitting circuit sends out a signal with a wavelength different from the wavelength dictated by the temperature set signal, when the semi-conductor laser device is at a temperature typically different from the set temperature, for example right after a set-up operation such as turning on a power supply.

Figure 4:
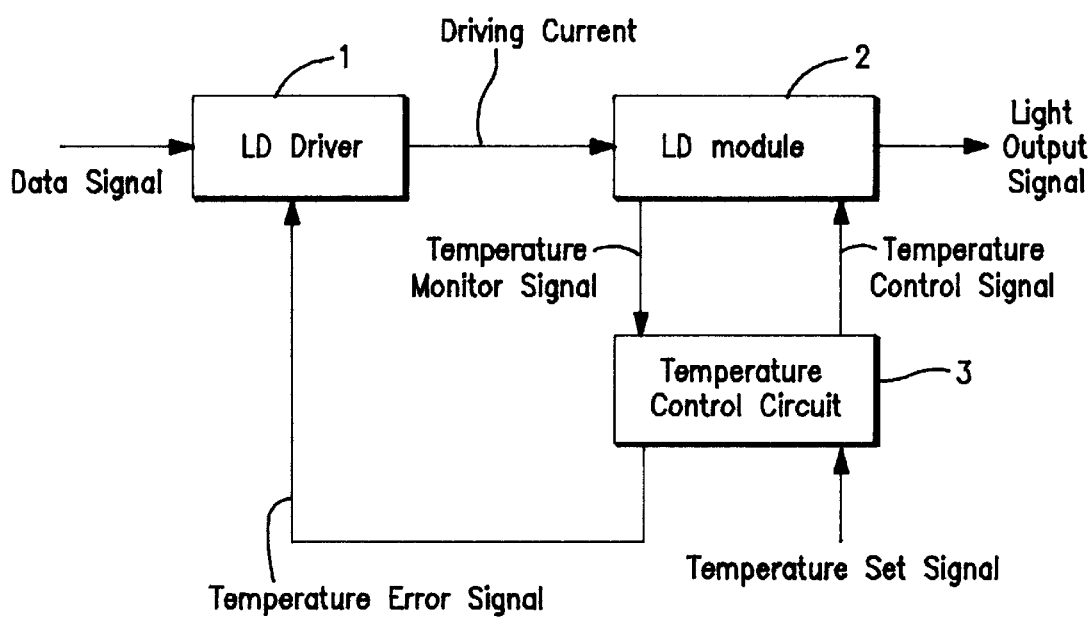
FIG. 4 is a block diagram of one embodiment according to the present invention.

Referring to FIG. 4, a light transmitting apparatus embodying the present invention is shown. FIG. 4 shows an example of a light signal transmitting circuit based on a direct modulation method. In FIG. 4, parts similar to those in FIG. 3 are designated by the same reference numerals. Referring to FIG. 4, a data signal is input to the LD driver 1. The LD driver 1 outputs a pulse current and a bias current (a driving current) for driving a semi-conductor laser and also cuts off the driving current responsive to a temperature error signal sent from a temperature control circuit 3. A LD module 2 comprises a semi-conductor laser device for outputting a light output signal corresponding to the driving current. The LD module 2 also comprises a temperature adjusting device, such as a Peltier device or the like, for adjusting a temperature of the laser device responsive to a temperature control signal from the temperature control circuit 3, and a temperature detecting device, such as a thermistor or the like, for detecting the temperature of the laser device. The temperature detecting device is placed close to a semi-conductor laser device in the LD module 2. The temperature control circuit 3 compares a temperature monitor signal, which is an output from the temperature detecting device of the LD module 2, with a temperature set signal sent from an outer portion. The temperature control circuit 3 also generates the temperature control signal based on a difference in the above mentioned comparing process. Furthermore, it generates the temperature error signal, if there is a difference equal to or more than a set threshold value between the temperature monitor signal and the temperature set signal.

At the beginning of an operation such as set-up of an apparatus or the like, a temperature within the LD module 2, that is, a temperature of the semi-conductor laser device, is significantly different from the set temperature. Thus, in that period, the temperature error signal is sent from the temperature control circuit 3 to the LD driver 1. While this temperature error signal is generated, the LD driver 1 stops the generation of the driving signal to thereby cut off the light output signal of the LD module 2.

Figure 5:
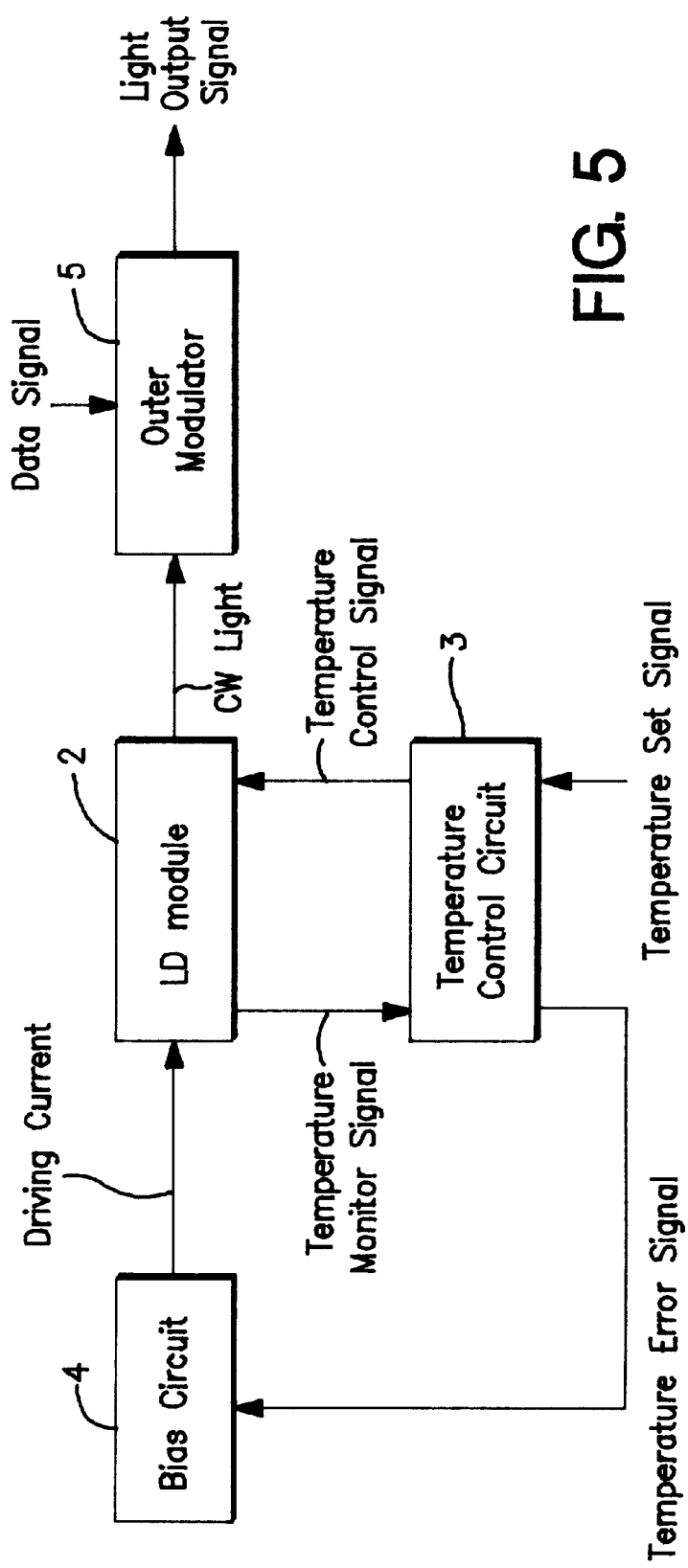
FIG. 5 is a block diagram of another embodiment according to the present invention.

FIG. 5 is a block diagram of another embodiment of the present invention, and the parts similar to those in FIG. 4 are designated by the same reference numerals. The embodiment shown in FIG. 5 is an example in which the present invention is applied to a light transmitting circuit based on an external modulation method.

Referring to FIG. 5, a bias circuit 4 generates a bias current (driving current) for driving a semi-conductor laser device in a LD module 2, and also stops the bias current on the basis of a temperature error signal input from a temperature control circuit 3. The LD module 2 comprises a semi-conductor laser device for directly outputting a CW (Continuous Wave) light by using this bias current, a temperature adjusting device, such as the Peltier device or the like, for adjusting its temperature and a temperature detecting device, such as the thermistor device or the like, for detecting temperature of the semi-conductor laser device.

An outer modulator 5 modulates the CW light sent from the LD module 2 by means of a data signal to be transmitted, and generates a light signal output. The temperature control circuit 3 is identical to that in FIG. 4.

In this embodiment, the temperature error signal is generated from the temperature control circuit 3 when the temperature of the semi-conductor laser device is significantly different (ie., by at least the threshold value) from the set temperature during the set-up process or the like. Thus, the bias circuit 4 cuts off the bias current on the basis of this temperature error signal. The output signal of the LD module 2 is stopped, as a result.

Figure 6:
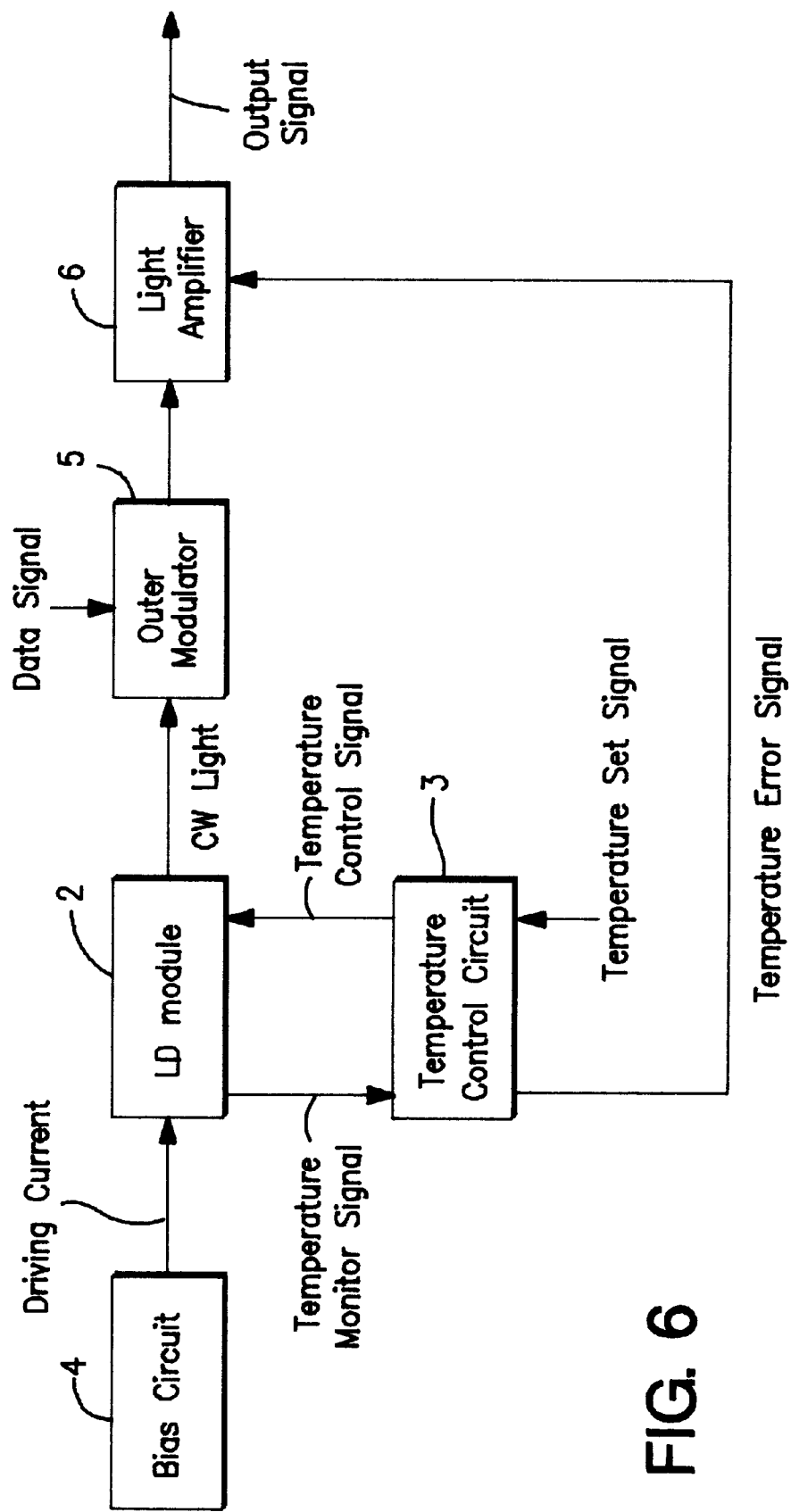
FIG. 6 is a block diagram of still another embodiment according to the present invention.

FIG. 6 is a block diagram showing still another embodiment in accordance with the present invention, and the parts similar to those in FIGS. 4 and 5 are designated by the same reference symbols. This embodiment is also a light transmitting apparatus using an external modulation method. However, a light amplifier 6 is mounted for amplifying a modulated output from an outer modulator 5. An active/non-active operation of the light amplifier 6 is controlled by a temperature error signal from a temperature control circuit 3.

That is, when the temperature of the semi-conductor laser device differs from the set temperature by at least the threshold value, the amplifying operation of the light amplifier 6 is stopped by the consequent temperature error signal, and a light output signal is thereby cut off. If a rare-earth-doped fiber amplifier is used as the light amplifier 6, the temperature error signal interrupts a stimulating light source of 1.48 $\mu$m.

When the temperature error signal is input to an LD driver or bias circuit, the driving current is inputted to the semi-conductor laser device, right before the light output signal is sent out. Therefore, the temperature of the semi-conductor laser device might be changed a little extent by input driving current. However, when the temperature error signal is input to a light amplifier, the temperature of the semi-conductor laser device is kept stable.

In these embodiments, wavelengths of the two adjacent light output signals are 1558.0 nm and 1559.0 nm, for example. However, the two wavelengths may be closer even to each other. A typical temperature of one semi-conductor laser device is approximately 30° C. The oscillating wavelength of the semi-conductor laser device changes at a rate of 0.1 nm/°C. corresponding to its temperature.

The temperature error signal may be enabled only when the difference between a temperature set signal and a temperature monitor signal is sufficiently small, and determined on the basis of a specification of the light wavelength multiplexing transmitting system. For example, the temperature error signal may be generated only when the difference between the set temperature and the monitored temperature of the semi-conductor laser device are less than 0.5 nm, 0.2 nm or 0.1 nm. The resolving power for detecting temperature by the temperature control circuit 3 is about 0.1° C. Therefore, a wavelength difference of 0.01 nm between two adjacent signals is detectable.

The duration of the temperature error signal is usually within about one second. The semi-conductor laser device of this embodiment is a 1.55 $\mu$m InGaAs DFB-Laser Diode or the like.

A light wavelength multiplexing transmission system can be implemented by applying the respective light transmitting circuits shown in FIGS. 4, 5 and 6 to respective light transmitting circuits 7 and 8 shown in FIG. 1.

According to the present invention, when the temperature of the semi-conductor laser device differs significantly from the temperature set value, the driving current inputted to the LD module is stopped. And, if a light amplifier is used in the later stage, the excitation of the light amplifier is stopped. Accordingly, the output from the light transmitting circuit is stopped. As a result, there is no influence on the output signal of the light transmitting circuit of a remaining wave length for the light wave length multiplexing operation, while the temperature of semi-conductor laser device is out of the temperature set value because of the set-up process or a failure, that is, while the wave length is not normal.

While the present invention has been described in connection with certain preferred embodiments, it is to be understood that the subject matter encompassed by the present invention is not limited to those specific embodiments. On the contrary, it is intended to include all alternatives, modifications and equivalents as can be included within the spirit and scope of the following claims.

What is claimed is:

1. A light transmitting apparatus comprising:
   a laser diode (LD) module including a semi-conductor laser device;
   a temperature control circuit for setting a temperature of said semi-conductor laser device to a set value, and outputting a temperature error signal which stops an output light signal from the apparatus when the temperature of said semi-conductor laser device differs from said set value by at least a predetermined value; and
   a driving current generating circuit for providing said semi-conductor laser device with a driving current.

2. The light transmitting apparatus according to claim 1, wherein said temperature error signal is input to said driving current generating circuit.

3. The light transmitting apparatus according to claim 1, wherein said driving current generating circuit includes a LD driver for outputting a pulse current and a bias current.

4. The light transmitting apparatus according to claim 1, further comprising an outer modulator receiving output from said LD module, wherein said driving current generating circuit includes a bias circuit for outputting a bias current to said LD module.

5. The light transmitting apparatus according to claim 1, further comprising a light amplifier receiving an output from said LD module, wherein said temperature error signal is input to said light amplifier.

6. The light transmitting apparatus according to claim 1, wherein said LD module includes a temperature adjusting device and a temperature detecting device.

7. A wavelength multiplexing light transmitting apparatus, comprising a plurality of light transmitting apparatus according to claim 1 and a light wavelength multiplexer receiving outputs of said plurality of light transmitting apparatus, wherein the set wavelengths of semiconductor laser devices in respective light transmitting apparatuses differ from each other.

8. A light transmitting method, comprising the steps of;
   monitoring a temperature of a semi-conductor laser device;
   comparing a set temperature of the semi-conductor laser device with said monitored temperature;
   stopping an output light signal when said monitored temperature of said semi-conductor laser device differs from said set temperature by at least a predetermined value.

9. The light transmitting method according to claim 8, wherein a temperature control circuit generates a temperature error signal to stop the output light signal.

10. The light transmitting method according to claim 9, wherein the temperature error signal is input to a light amplifier and stops an amplifying operation so as to stop an output light signal.

11. The light transmitting method according to claim 9, wherein the temperature error signal is input to a driving current generating means, and stops said driving current so as to stop an output light signal.

12. In an apparatus having an output for transmitting a light signal, a laser diode module with a semiconductor laser, a driver circuit for driving the laser diode module to provide a laser light therefrom, and a temperature controller for adjusting a temperature of the semiconductor laser, the improvement wherein the temperature controller has a port that provides a temperature error signal upon starting the apparatus and continues to provide the error signal so long as the temperature of the semiconductor laser differs from a reference temperature by at least a predetermined value, the port being connected to the apparatus to prevent initiation of transmission of the light signal from the apparatus until termination of the error signal.

13. The apparatus of claim 12, wherein the laser light from the laser diode module is the light signal, and wherein the improvement further comprises the connection of said port to the driver circuit so that the driver circuit does not drive the laser diode module and the laser diode module does not provide the light signal so long as the error signal is present.

14. The apparatus of claim 12, wherein the apparatus also has a light amplifier for amplifying the laser light from the laser driver module and the amplified laser light from the light amplifier is the light signal, and wherein the improvement further comprises the connection of said port to the light amplifier so that the light amplifier does not provide the light signal so long as the error signal is present.

15. In a method for transmitting a light signal from an apparatus in which a semiconductor laser is driven by a driver circuit to provide a laser light therefrom, and a temperature controller adjusts a temperature of the semiconductor laser, the improvement comprising the steps of providing from the temperature controller a temperature error signal upon starting the apparatus, continuing to provide the error signal so long as the temperature of the semiconductor laser differs from a reference temperature by at least a predetermined value, and preventing initiation of transmission of the light signal from the apparatus until termination of the error signal.

16. The method of claim 15, wherein the laser light from the semi-conductor laser is the light signal, and wherein the improvement further comprises the step of using the error signal to stop the driver circuit from driving the semiconductor laser so that the semiconductor laser does not provide the light signal so long as the error signal is present.

17. The method of claim 15, wherein the apparatus also amplifies the laser light and the amplified laser light is the light signal, and wherein the improvement further comprises the step of using the error signal to stop the light amplifier from providing the light signal so long as the error signal is present.

* * * * *